United States Patent

Palmer

(10) Patent No.: US 9,474,160 B2
(45) Date of Patent: Oct. 18, 2016

(54) PRINTED CIRCUIT BOARD APPARATUS AND METHODS OF MAKING THE SAME

(75) Inventor: Logan Peter Palmer, Santa Monica, CA (US)

(73) Assignee: Advanced Bionics AG, Staefa (CH)

( * ) Notice: Subject to any disclaimer, the term of this patent is extended or adjusted under 35 U.S.C. 154(b) by 151 days.

(21) Appl. No.: 14/400,261

(22) PCT Filed: May 18, 2012

(86) PCT No.: PCT/US2012/038576
§ 371 (c)(1),
(2), (4) Date: Nov. 20, 2014

(87) PCT Pub. No.: WO2013/172849
PCT Pub. Date: Nov. 21, 2013

(65) Prior Publication Data
US 2015/0098196 A1    Apr. 9, 2015

(51) Int. Cl.
| H05K 7/00 | (2006.01) |
| H05K 1/18 | (2006.01) |
| H05K 3/28 | (2006.01) |
| H05K 9/00 | (2006.01) |
| H05K 3/00 | (2006.01) |
| H05K 3/46 | (2006.01) |

(52) U.S. Cl.
CPC ............ *H05K 1/189* (2013.01); *H05K 3/0091* (2013.01); *H05K 3/284* (2013.01); *H05K 9/0022* (2013.01); *H05K 3/4691* (2013.01); H05K 2201/0158 (2013.01); H05K 2201/0162 (2013.01); H05K 2201/042 (2013.01); H05K 2201/055 (2013.01); H05K 2201/056 (2013.01); Y10T 29/49124 (2015.01)

(58) Field of Classification Search
CPC ...................... H05K 1/189; H05K 2201/0158; H05K 2201/0162; H05K 2201/042; H05K 2201/055; H05K 2201/056; H05K 3/0091; H05K 3/284; H05K 3/4691; H05K 9/0022; Y10T 29/49124
See application file for complete search history.

(56) References Cited

U.S. PATENT DOCUMENTS

| 5,350,594 | A | 9/1994 | Unruh | |
| 6,127,038 | A * | 10/2000 | McCullough | H01L 23/293 257/687 |
| 8,569,869 | B2 * | 10/2013 | Park | H01L 25/105 257/508 |
| 2002/0129951 | A1 | 9/2002 | Babb et al. | |
| 2002/0129971 | A1 | 9/2002 | Kolb et al. | |
| 2003/0117787 | A1 * | 6/2003 | Nakauchi | H05K 1/0218 361/818 |
| 2006/0152913 | A1 * | 7/2006 | Richey | H05K 1/0218 361/818 |
| 2009/0000114 | A1 | 1/2009 | Rao et al. | |
| 2011/0085316 | A1 * | 4/2011 | Myers | H05K 3/284 361/818 |

FOREIGN PATENT DOCUMENTS

| GB | 2295526 A | 5/1996 |
| WO | WO 03/041463 A2 | 5/2003 |

OTHER PUBLICATIONS

PCT International Search and Written Opinion dated Apr. 9, 2014 for PCT App. Ser. No. PCT/US2012/038576.

* cited by examiner

*Primary Examiner* — Yuriy Semenenko
(74) *Attorney, Agent, or Firm* — Henricks, Slavin & Holmes LLP (57) ABSTRACT

Printed circuit board apparatus with electromagnetic interference shields and methods of making the same.

20 Claims, 6 Drawing Sheets

PRINTED CIRCUIT BOARD APPARATUS AND METHODS OF MAKING THE SAME

CROSS-REFERENCE TO RELATED APPLICATIONS

This application is the U.S. National Stage of PCT App. Ser. No. PCT/US2012/038576, filed May 18, 2012.

BACKGROUND

1. Field

The present disclosure relates generally to printed circuit board assemblies ("PCBAs") and electromagnetic interference ("EMI") shields.

2. Description of the Related Art

There are many instances where a PCBA, which includes a printed circuit board ("PCB") and electronic components mounted on the PCB, is combined with an EMI shield to form a PCB apparatus. For example, sound processors employed in cochlear implant systems may include such a PCB apparatus. The EMI shield prevents electromagnetic emissions generated by the electronic components on the PCB from interfering with other electronic components on the PCB. The EMI shield may also be used to prevent electromagnetic emissions from emanating beyond the PCB apparatus, and to prevent externally generated electromagnetic emissions from interfering with the electronic components of the PCB apparatus.

Some conventional EMI shields consist of one or more EMI containment enclosures that are secured to the PCBA over the electronic components. The present inventor has determined that such containment enclosures, while effective, tend to increase the size of the PCB apparatus and also add to component costs and assembly costs. Other conventional EMI shields consist of an electrically insulating coating that is applied to the PCBA and an electrically conductive coating that is applied over the insulating coating. The present inventor has determined that conventional coating-based methods are susceptible to improvement. For example, the present inventor has determined that conventional coating-based EMI shields are not well suited for use with three-dimensional PCBAs because the employed insulating coatings may crack when the PCBA is folded into the three-dimensional shape, which can lead to shorts, and the employed electrically conductive coatings are thin, solvent-based materials that will not properly fill the internal volume defined by the folded PCBA.

SUMMARY

A printed circuit board apparatus in accordance with at least one of the present inventions may have, among other things, a printed circuit board assembly first portion including a printed circuit board first portion and at least one electronic component, a printed circuit board assembly second portion including a printed circuit board second portion and at least one electronic component, an electrically non-conductive conformal coating on at least the substantial majority of one side of the printed circuit board assembly first and second portions, and an electrically conductive adhesive that fills the internal volume between the electrically non-conductive coating on the printed circuit board assembly first portion and the electrically non-conductive coating on the printed circuit board assembly second portion.

A method in accordance with at least one of the present inventions includes the step of filling an internal volume defined by a three-dimensional printed circuit board assembly, which has an electrically non-conductive coating over a substantial majority of a side that faces the internal volume, with an electrically conductive adhesive.

There are a number of advantages associated with such apparatus and methods. For example, the present apparatus and methods obviate the need for EMI containment enclosures in three-dimensional PCB apparatus. The present apparatus and methods also are, or also result in, a three-dimensional PCB apparatus that is less likely to experience cracking of the electrically non-conductive material, and is more mechanically robust, than a three-dimensional PCB apparatus made using conventional coating-based EMI shield techniques.

The above described and many other features of the present inventions will become apparent as the inventions become better understood by reference to the following detailed description when considered in conjunction with the accompanying drawings.

BRIEF DESCRIPTION OF THE DRAWINGS

Detailed descriptions of the exemplary embodiments will be made with reference to the accompanying drawings.

DETAILED DESCRIPTION OF THE EXEMPLARY EMBODIMENTS

The following is a detailed description of the best presently known modes of carrying out the inventions. This description is not to be taken in a limiting sense, but is made merely for the purpose of illustrating the general principles of the inventions.

Figure 1:
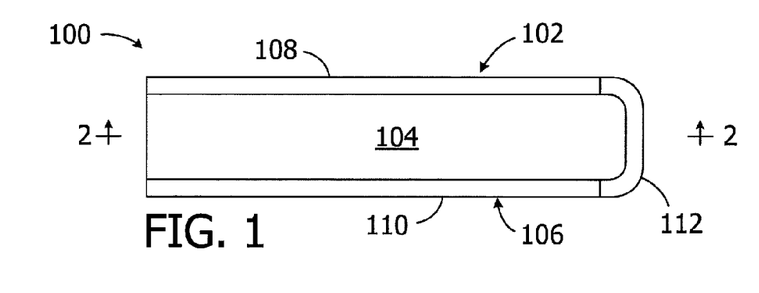
FIG. 1 is a side view of a printed circuit board apparatus ("PCB apparatus") in accordance with one embodiment of a present invention.
Figure 2:
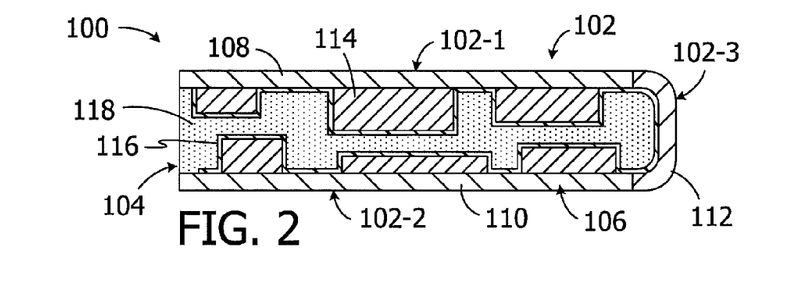
FIG. 2 is a section view taken along line 2-2 in FIG. 1.
Figure 3:
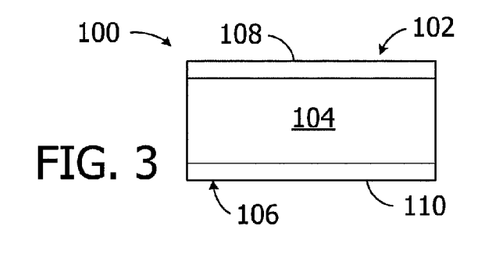
FIG. 3 is an end view of the exemplary PCB apparatus illustrated in FIG. 1.

As illustrated in FIGS. 1-3, an exemplary printed circuit board apparatus ("PCB apparatus") 100 in accordance with at least one of the present inventions includes a printed circuit board assembly ("PCBA") 102 and an electromagnetic interference ("EMI") shield 104. Embodiments of the present inventions may include a wide variety of PCBAs. In the illustrated implementation, the PCBA 102 includes a printed circuit board ("PCB") 106 with first and second relatively rigid portions 108 and 110 and a relatively flexible portion 112. A plurality of electronic components 114, some of which emit EMI, may be mounted on the PCB 106. Such electronic components 114 may include, but are not limited to, capacitors, resistors, inductors, transistors, diodes, transformers, integrated circuits, hybrid sub-assemblies, and connectors. Ground contacts 115 (FIG. 6) are located at the longitudinal ends of the PCB 106 in the illustrated implementation, but may be located at any other suitable location in other implementations. The exemplary EMI shield 104, which is discussed in greater detail below, includes electrically non-conductive material 116 and electrically conductive adhesive 118. The electrically non-conductive material 116 prevents the conductive adhesive 118 from making direct electrical contact with the PSBA conductors and electronic components. The electrically non-conductive material 116 may be in the form of a thin layer that coats the substantial majority of the surface of the PCBA 102 and also conforms to the respective shapes of the electronic components 114, while the conductive adhesive occupies the internal volume 126 (FIGS. 7 and 8) that is defined by the PCBA 102 and not already occupied by the layer of electrically non-conductive material 116. The PCB apparatus 100 may be connected to the remainder of the underlying device (e.g., to the remainder of a sound processor) through wires, connectors, and/or flexible extensions of the PCB 102 that are soldered to other parts.

The PCB 106 may include conventional components such as, for example, a plastic base (e.g., a polyamide, fiberglass and epoxy composite) and conductive traces, and may include multiple layers that are connected to one another by vias as is known to those of skill in the art. For example, the PCB 106 may include a ground plane (not shown) that, in addition to its grounding functionality, also provides EMI shielding on the sides of the PCBA 102 opposite the EMI shield 104. In the illustrated implementation, the first and second PCB portions 108 and 110, and the electronic components 114 thereon, define first and second PCBA portions 102-1 and 102-2, and the flexible portion 112 defines a third PCBA portion 102-3.

The electrically non-conductive material 116 in the illustrated embodiment is formed in a thin layer (e.g., about 0.005 mm to 0.250 mm thick) that conforms to the topography of the PCB 106, thereby coating the electronic components 114 and the portions of the PCB 106 not covered by the electronic components. Because the non-conductive material 116 conforms to the topography of the PCBA 102, the thickness of the layer will be constant or at least substantially constant. In those instances where the PCBA 102 will be bent, folded or otherwise re-shaped after the electrically non-conductive material 116 is applied, the electrically non-conductive material should also be flexible enough to resist cracking that could ultimately lead to shorts. One example of a suitable electrically non-conductive material 116 is a chemical vapor deposited poly(p-xylylene) polymer sold under the tradename Parylene. In many instances, both sides of the PCBA 102 will be coated during a vapor deposition process. Other suitable electrically non-conductive materials include, but are not limited to, urethane.

The electrically conductive adhesive 118 may be an adhesive that, in addition to being electrically conductive (e.g., a conductivity of about $2 \times 10^{-4}$ to $1 \times 10^{-3}$ ohm-cm in some implementations), is relatively high in bond strength (e.g., a lap shear strength of about 100-1500 psi and a die shear strength of about 5-20 kg/die for a 2 mm×2 mm silicon die in some implementations), is relatively high in viscosity (e.g., about 2,000 to 200,000 centipoise in some implementations), and is mechanically stable in that it does not shrink, or only shrinks minimally, as it cures (or "hardens"). Such properties allow the electrically conductive adhesive 118 to completely fill the internal volume 126 (FIGS. 7 and 8), including the gaps 124 (FIGS. 5 and 6) between the coated electronic components 114, after curing of the adhesive. As such, the electronic components 114 of the PCBA 102 are EMI shielded from one another. Such properties also insure that the cured electrically conductive portion of the EMI shield 104 will adhere to the electrically non-conductive material 116 and to other intended structures (e.g., ground contacts 115 and adjacent surfaces of the PCB 106 that are not coated with the non-conductive material). Although the present inventions are not limited to any particular electrically conductive adhesive, suitable examples include metal filled epoxy (i.e., epoxy resin with metal particles) and metal filled silicone adhesive (i.e., silicone adhesive with metal particles). Suitable metal particles include, but are not limited to, silver particles.

The present inventions also include methods of manufacturing PCB apparatus, such as the exemplary PCB apparatus 100, that have an EMI shield which consists of an electrically non-conductive material and electrically conductive adhesive. One exemplary method is illustrated in FIGS. 4-10.

Figures 4, 5:
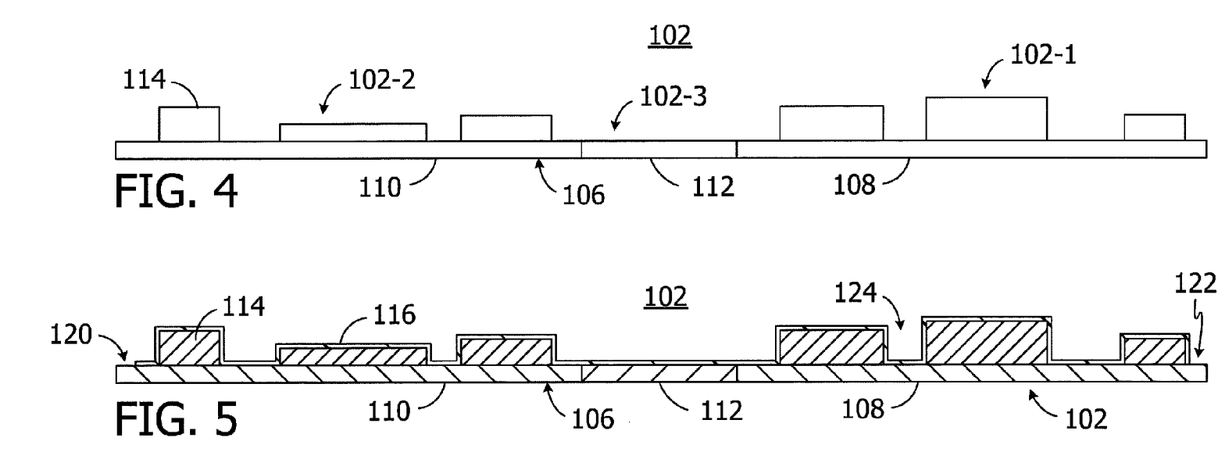
FIG. 4 is a side view of an exemplary printed circuit board assembly ("PCBA").
FIG. 5 is a section view of the PCBA illustrated in FIG. 4 with an exemplary electrically non-conductive coating applied thereto.

Referring first to FIG. 4, the exemplary PCBA 102 is shown in a two-dimensional (or "flat") state. Although the PCBA 102 has a thickness, i.e., the combined thickness of the PCB 106 and the electronic components 114, a PCBA is considered to be in a two-dimensional state when all portions of a PCB (e.g., portions 108, 110 and 112 of PCB 106 in FIG. 4) are coplanar.

Figure 6:
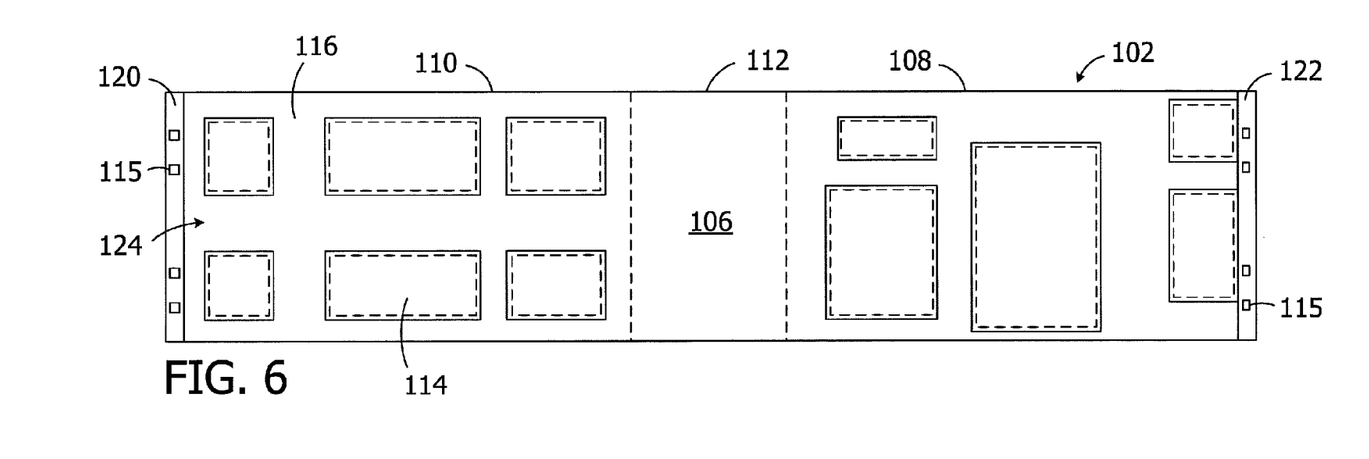
FIG. 6 is a plan view of the coated PCBA illustrated in FIG. 5.

Turning to FIGS. 5 and 6, the surface of the PCBA 102 may be coated with the electrically non-conductive material 116 by way of, for example, chemical vapor deposition, spraying, or any other suitable process. Portions of the PCB 106 with the ground contacts 115 may be masked, which results in uncoated regions 120 and 122. In other words, the substantial majority of top surface (in the illustrated orientation) of the PCBA 102 is coated by the electrically non-conductive material 116. The uncoated ground contacts 115 will, ultimately, provide electrical contact points for the conductive adhesive 118 to ground the EMI shield 104. In other implementations, where one or more ground contacts are located at other locations on the PCB (e.g., between adjacent electronic components), such locations will also be masked to create uncoated regions at the ground contacts. As noted above, the electrically non-conductive material 116 forms a thin layer that conforms to the topography of the PCB 106. The thin, conformal coating results in gaps 124 between adjacent electronic components 114 that will, after further processing, be filled with the electrically conductive adhesive 118 to provide EMI shielding between adjacent electronic components as is described above with reference to FIGS. 1-3.

Figure 7:
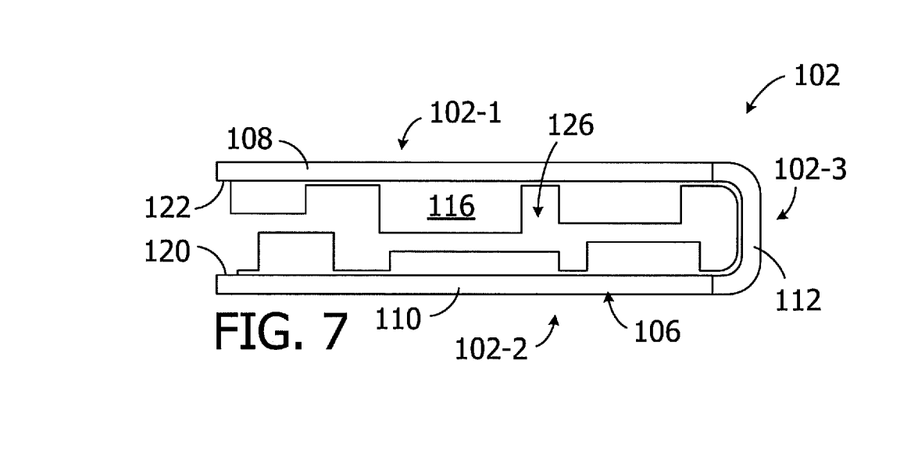
FIG. 7 is a side view of the coated PCBA illustrated in FIGS. 5 and 6 in a three-dimensional state.
Figure 8:
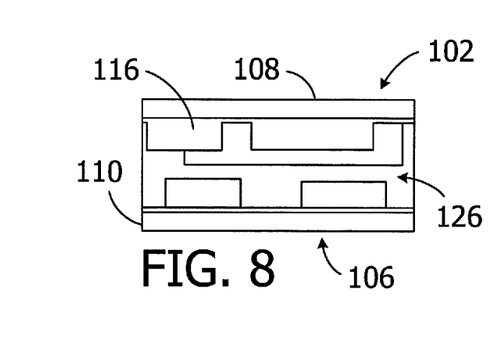
FIG. 8 is an end view of the coated three-dimensional PCBA illustrated in FIG. 7.

The PCBA 102 with the electrically non-conductive material 116 (or "coated PCBA") may then be reshaped from the two-dimensional state illustrated in FIGS. 5 and 6 to the three-dimensional (or "non-flat") state illustrated in FIGS. 7 and 8 by folding, bending, or any other suitable process. In the illustrated embodiment, the coated PCBA is reshaped into a generally U-shaped configuration where the coated PCBA portions 102-1 and 102-2 face one another. The first and second relatively rigid portions 108 and 110 are parallel to one another and the relatively flexible portion 112 is bent, folded or otherwise reshaped into the base of the U-shape. In this configuration, the coated PCBA portions 102-1, 102-2 and 102-3 together define an internal volume (or "void") 126 that will be subsequently filled with the conductive adhesive 118. The magnitude of the internal volume 126 in the illustrated embodiment is essentially equal to the volume between first and second relatively PCB rigid portions 108 and 110, less the volume occupied by the electronic components 114, and including the gaps 124. The electrically non-conductive material 116 also occupies some of the volume between first and second relatively PCB rigid portions 108 and 110, but this volume is negligible.

Figure 9:
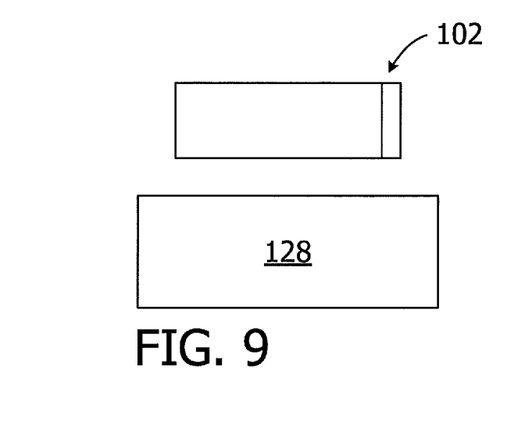
FIG. 9 is a side view showing the coated three-dimensional PCBA illustrated in FIGS. 7 and 8 being inserted into a fixture.
Figure 10:
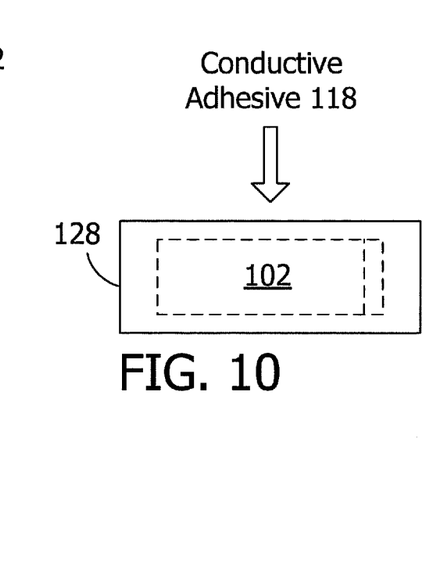
FIG. 10 is a side view showing conductive adhesive being transferred into the internal volume of the coated three-dimensional PCBA within the fixture.
Figure 10A:
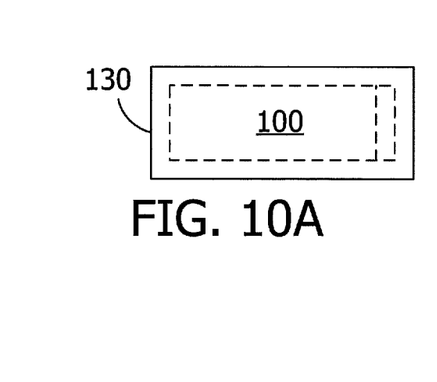
FIG. 10A is a side view of an exemplary PCB apparatus within a housing.

To that end, and referring to FIGS. 9 and 10, the three-dimensionally configured and coated PCBA 102 may then be inserted into a fixture 128 that has a mold (not shown). The internal volume 126 (FIGS. 7 and 8) may then be filled with the conductive adhesive 118. In other words, the conductive adhesive 118 will occupy the entire void defined by the PCBA portions 102-1, 102-2 and 102-3 and coating 116, including the gaps 124 between the individual electronic components 114, as is illustrated in FIGS. 1-3. The conductive adhesive 118 will be allowed to cure or will be cured (e.g., by elevating temperature above room temperature), thereby completing the EMI shield 104. The PCB apparatus 100 may then be removed from the fixture 128 and mold. Thereafter, the PCB apparatus 100 may be inserted into the housing or case 130 (or portion thereof) of the device in which it will be employed (e.g., a portion of a cochlear implant sound processor housing), as illustrated in FIG. 10A.

Figure 11:
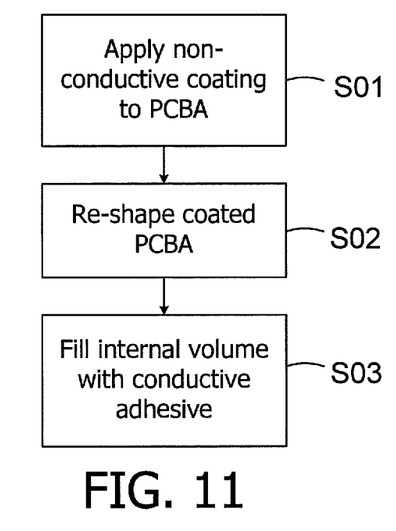
FIG. 11 is block diagram illustrating the steps of an exemplary method in accordance with one embodiment of a present invention.
Figure 12:
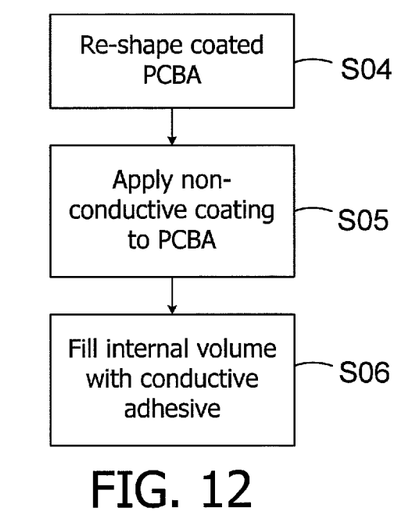
FIG. 12 is block diagram illustrating the steps of an exemplary method in accordance with one embodiment of a present invention.

The above-described exemplary method is summarized in the flow chart illustrated in FIG. 11. First, the electrically non-conductive material is applied to a two-dimensional PCBA (Step S01). The coated PCBA is then reshaped into a three-dimensional configuration (Step S02), and the internal volume defined by the three-dimensional PCBA is filled with electrically conductive adhesive (Step S03). It should be noted here that the order of "non-conductive material" and "reshaping" steps may be reversed, as is illustrated in FIG. 12, where the process for forming the layer of non-conductive material (e.g., a chemical vapor deposition process) allows the layer to be formed on a three-dimensional PCBA. Here, the PCBA is reshaped into a three-dimensional configuration (Step S04), then the electrically non-conductive material is applied to the three-dimensional PCBA (Step S05), and the internal volume defined by the three-dimensional PCBA is filled with electrically conductive adhesive (Step S06).

Figure 13:
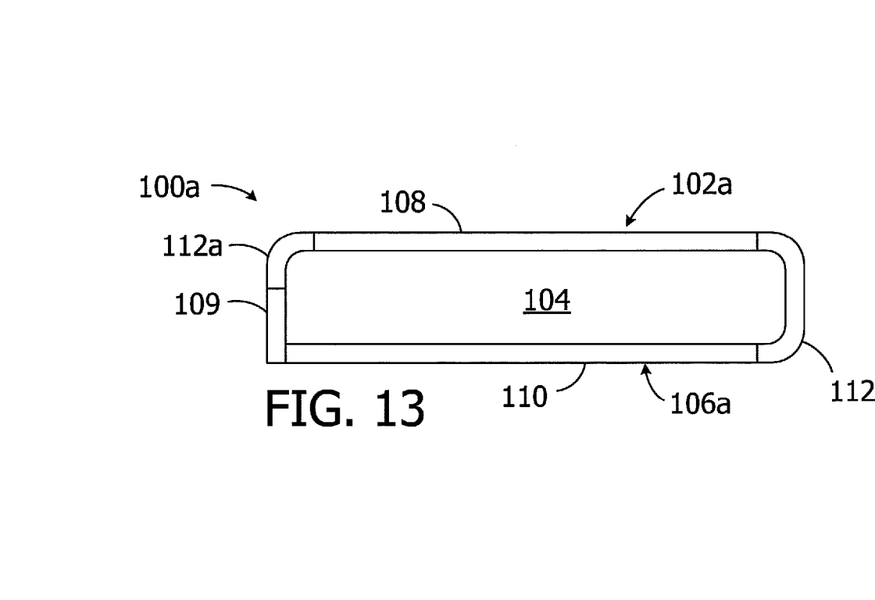
FIG. 13 is a side view of a PCB apparatus in accordance with one embodiment of a present invention.
Figure 14:
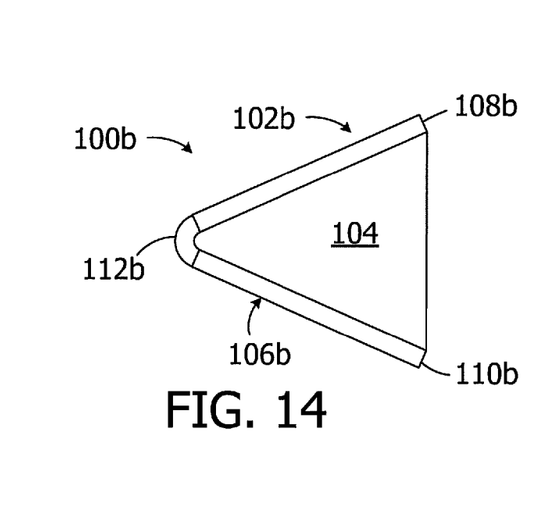
FIG. 14 is a side view of a PCB apparatus in accordance with one embodiment of a present invention.

It should also be noted here that the present inventions are not limited to a three-part PCB assembly with a rigid-flexible-rigid configuration or to the exemplary U-shape. By way of example, but not limitation, the exemplary PCB apparatus 100a and 100b illustrated in FIGS. 13 and 14 are substantially similar to PCB apparatus 100 and similar elements are represented by similar reference numerals. Here, however, the PCBA 102a illustrated in FIG. 13 includes a PCB 106a with additional flexible portion 112a and an additional relatively rigid portion 109. Turning to the PCB apparatus 100b illustrated in FIG. 14, the PCBA 102b includes a PCB 106b with rigid portions 108b and 110b that are connected by a flexible portion 112b and face one another, but are not parallel to one another. The PCB apparatus 100b also has an EMI shield 104 formed from a thin layer of electrically non-conductive material that coats the substantial majority of the surface of the PCBA 102b and also conforms to the respective shapes of the electronic components, an conductive adhesive that occupies the internal volume that is defined by the PCBA 102b and not already occupied by the layer of electrically non-conductive material.

Figure 15:
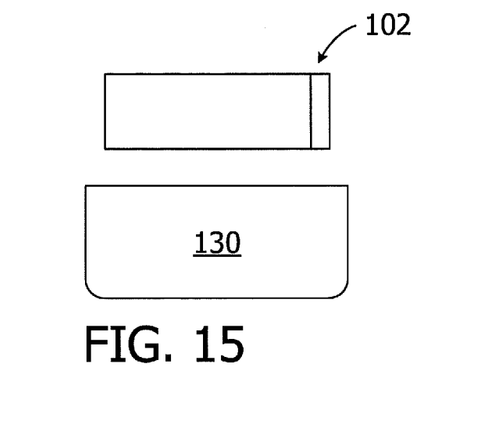
FIG. 15 is a side view showing the coated three-dimensional PCBA illustrated in FIGS. 7 and 8 being inserted into a housing.
Figure 16:
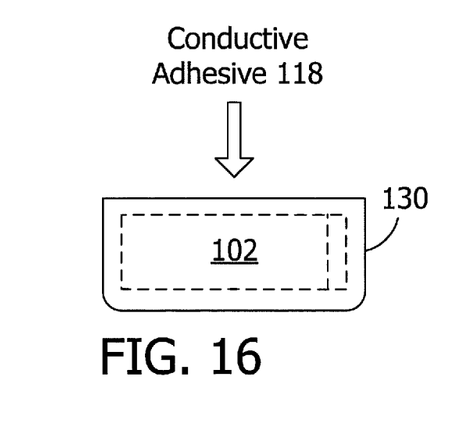
FIG. 16 is a side view showing conductive adhesive being transferred into the internal volume of the coated three-dimensional PCBA within the housing.
Figure 17:
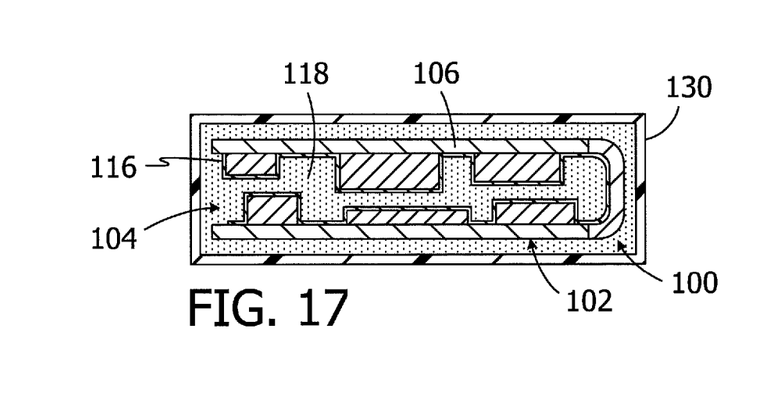
FIG. 17 is a section view of an exemplary PCB apparatus within a housing.
Figure 18:
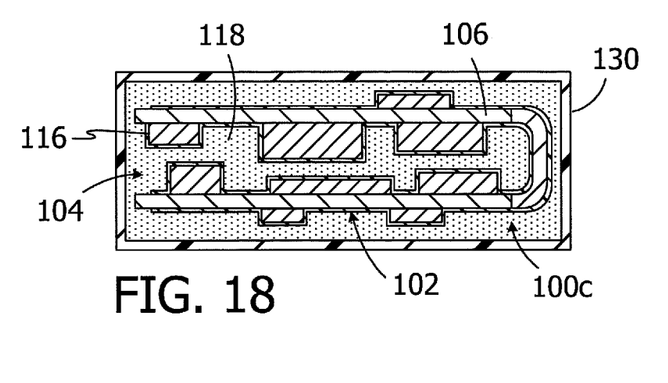
FIG. 18 is a section view of an exemplary PCB apparatus within a housing.

In some instances, the conductive adhesive may be added to the three-dimensionally configured and non-conductive material coated PCBA after the PCBA has been inserted into the housing or case (or portion thereof) of the device in which it will be employed (e.g., a portion of a cochlear implant sound processor housing). As illustrated for example in FIGS. 15-17, after the three-dimensionally configured and non-conductive material coated PCBA 102 has been inserted into a housing 130, conductive adhesive 118 may be dispensed into the internal volume 126 (note FIGS. 7 and 8) that is defined by the PCBA. The conductive adhesive 118 may also be dispensed into the space between the walls of the housing 130 and the PCB apparatus 100 to provide additional EMI shielding and structural integrity. Turning the exemplary PCB apparatus 100c illustrated in FIG. 18, in those instances where there are also electronic components 114 and/or exposed conductors on the other side of the PCB 106, the electrically non-conductive material 116 may be applied to both sides of the PCBA 102.

Although the inventions disclosed herein have been described in terms of the preferred embodiments above, numerous modifications and/or additions to the above-described preferred embodiments would be readily apparent to one skilled in the art. By way of example, but not limitation, the inventions include any combination of the elements from the various species and embodiments disclosed in the specification that are not already described. The present inventions also include sound processors including the above-described PCB apparatus. It is intended that the scope of the present inventions extend to all such modifications and/or additions and that the scope of the present inventions is limited solely by the claims set forth below.

I claim:
1. A printed circuit board apparatus, comprising:
   a printed circuit board assembly first portion including a printed circuit board first portion and a first plurality of electronic components arranged on the printed circuit board first portion such that gaps are defined between adjacent electronic components;

a printed circuit board assembly second portion including a printed circuit board second portion and at least one electronic component on the printed circuit board second portion;

an electrically non-conductive conformal coating on at least the substantial majority of one side of the printed circuit board assembly first portion and at least the substantial majority of one side of the printed circuit board assembly second portion;

the printed circuit board assembly first portion and the printed circuit board assembly second portion being positioned relative to one another such that the printed circuit board first portion faces the printed circuit board second portion and an internal volume is defined between the electrically non-conductive coating on the printed circuit board assembly first portion and the electrically non-conductive coating on the printed circuit board assembly second portion; and an electrically conductive adhesive that fills the internal volume and that is located within the gaps defined between adjacent electronic components on the printed circuit board assembly first portion.

2. A printed circuit board apparatus as claimed in claim 1, wherein
the printed circuit board first portion and/or the printed circuit board second portion is rigid.

3. A printed circuit board apparatus as claimed in claim 1, wherein
the printed circuit board first portion and/or the printed circuit board second portion is planar.

4. A printed circuit board apparatus as claimed in claim 1, wherein
the printed circuit board first portion and the printed circuit board second portion are substantially parallel to one another.

5. A printed circuit board apparatus as claimed in claim 1, further comprising:
a printed circuit board assembly third portion that extends from the printed circuit board assembly first portion to the printed circuit board assembly second portion.

6. A printed circuit board apparatus as claimed in claim 1, wherein
the electrically non-conductive coating comprises an electrically non-conductive material selected from the group consisting of poly(p-xylylene) polymer and urethane.

7. A printed circuit board apparatus as claimed in claim 1, wherein
the electrically conductive adhesive comprises a high viscosity electrically conductive adhesive.

8. A printed circuit board apparatus as claimed in claim 1, wherein
the electrically conductive adhesive comprises an electrically conductive adhesive selected from the group consisting of metal filled epoxy and metal filled silicone adhesive.

9. A method of making a printed circuit board apparatus, comprising the step of:
filling an internal volume defined by a three-dimensional printed circuit board assembly, which has an electrically non-conductive conformal coating over a substantial majority of a side that faces the internal volume, with an electrically conductive adhesive.

10. A method as claimed in claim 9, further comprising the steps of:
coating a two-dimensional printed circuit board assembly with electrically non-conductive material; and
after the coating step, reshaping the coated two-dimensional printed circuit board assembly into the three-dimensional printed circuit board assembly.

11. A method as claimed in claim 9, further comprising the steps of:
reshaping a two-dimensional printed circuit board assembly into the three-dimensional printed circuit board assembly; and
after the reshaping step, coating the three-dimensional printed circuit board assembly with electrically non-conductive material.

12. A method as claimed in claim 9, wherein
the three-dimensional printed circuit board assembly includes a first portion, a second portion that faces the first portion, and a third portion that connects the first portion to the second portion.

13. A method as claimed in claim 12, wherein
the first and second portions are rigid and the third portion is flexible.

14. A method as claimed in claim 12, wherein
the first and second portions are substantially parallel to one another.

15. A method as claimed in claim 9, wherein
the electrically non-conductive coating comprises an electrically non-conductive material selected from the group consisting of poly(p-xylylene) polymer and urethane.

16. A method as claimed in claim 9, wherein
the electrically conductive adhesive comprises a high viscosity electrically conductive adhesive.

17. A method as claimed in claim 9, wherein
the electrically conductive adhesive comprises an electrically conductive adhesive selected from the group consisting of metal filled epoxy and metal filled silicone adhesive.

18. A method as claimed in claim 10, further comprising the step of:
prior to coating, masking portions of the printed circuit board assembly that have ground contacts.

19. A method as claimed in claim 11, further comprising the step of:
prior to coating, masking portions of the printed circuit board assembly that have ground contacts.

20. A method as claimed in claim 9, wherein
three-dimensional printed circuit board assembly includes electronic components on a side that faces the internal volume with gaps that form part of the internal volume located between adjacent electronic components.

* * * * *